(12) United States Patent
Ye et al.

(10) Patent No.: US 10,308,808 B2
(45) Date of Patent: *Jun. 4, 2019

(54) ORGANIC SILICONE RESIN COMPOSITION AND PRE-PREG, LAMINATE, COPPER-CLAD LAMINATE, AND ALUMINUM SUBSTRATE THAT USE THE COMPOSITION

(71) Applicant: SHENGYI TECHNOLOGY CO., LTD., Guangdong (CN)

(72) Inventors: Suwen Ye, Guangdong (CN); Guofang Tang, Guangdong (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/539,467

(22) PCT Filed: Jun. 1, 2015

(86) PCT No.: PCT/CN2015/080474
§ 371 (c)(1),
(2) Date: Jun. 23, 2017

(87) PCT Pub. No.: WO2016/101535
PCT Pub. Date: Jun. 30, 2016

(65) Prior Publication Data
US 2017/0349750 A1 Dec. 7, 2017

(30) Foreign Application Priority Data
Dec. 25, 2014 (CN) .......................... 2014 1 0829549

(51) Int. Cl.
| | |
|---|---|
| C08L 83/06 | (2006.01) |
| B32B 27/04 | (2006.01) |
| C08K 3/36 | (2006.01) |
| C08K 5/098 | (2006.01) |
| C08L 83/04 | (2006.01) |
| C08K 3/013 | (2018.01) |
| B32B 38/08 | (2006.01) |
| C08G 77/08 | (2006.01) |
| C08G 77/00 | (2006.01) |
| C08J 5/24 | (2006.01) |
| H05K 1/03 | (2006.01) |
| C09D 183/06 | (2006.01) |
| C08G 77/16 | (2006.01) |
| C08G 77/18 | (2006.01) |

(52) U.S. Cl.
CPC .............. *C08L 83/06* (2013.01); *B32B 27/04* (2013.01); *B32B 38/08* (2013.01); *C08G 77/08* (2013.01); *C08G 77/16* (2013.01); *C08G 77/18* (2013.01); *C08G 77/80* (2013.01); *C08J 5/24* (2013.01); *C08K 3/013* (2018.01); *C08K 3/36* (2013.01); *C08K 5/098* (2013.01); *C08L 83/04* (2013.01); *C09D 183/06* (2013.01); *H05K 1/036* (2013.01); *H05K 1/0373* (2013.01); *B32B 2307/304* (2013.01); *B32B 2307/3065* (2013.01); *H05K 2201/0162* (2013.01); *H05K 2201/0358* (2013.01); *H05K 2201/068* (2013.01)

(58) Field of Classification Search
None
See application file for complete search history.

(56) References Cited

U.S. PATENT DOCUMENTS

| | | | | |
|---|---|---|---|---|
| 3,018,270 A | * | 1/1962 | Toogood | C08G 77/16 528/10 |
| 4,385,158 A | * | 5/1983 | Mikami | C08G 59/1472 525/476 |
| 4,657,986 A | * | 4/1987 | Isayama | C08G 59/4085 525/100 |
| 5,280,098 A | * | 1/1994 | Witucki | C09D 183/06 525/100 |
| 5,482,992 A | * | 1/1996 | Kimura | C08G 65/336 524/588 |
| 7,732,496 B1 | * | 6/2010 | Leventis | C04B 35/14 423/335 |
| 9,663,664 B2 | * | 5/2017 | Tasaki | C09D 11/102 |

(Continued)

FOREIGN PATENT DOCUMENTS

| | | |
|---|---|---|
| CN | 101712799 A | 5/2010 |
| CN | 101724268 A | 6/2010 |

(Continued)

OTHER PUBLICATIONS

Patent Cooperation Treaty (PCT), International Search Report and Written Opinion for Application PCT/CN2015/080474 filed Jun. 1, 2015 dated Oct. 10, 2015, International Searching Authority, CN.

*Primary Examiner* — Robert S Loewe
(74) *Attorney, Agent, or Firm* — McDonald Hopkins LLC

(57) ABSTRACT

The present invention relates to an organic silicone resin composition and a prepreg, a laminate, and an aluminum substrate that use the composition. The organic silicone resin composition comprises in terms of parts by weight: 100 parts of a condensation-type silicone resin, 0.0001-2 parts of a catalyst, and 0.001-10 parts of an additive. The organic silicone resin composition has the advantages of high heat resistance, halogen-free and phosphorus-free flame retardancy, improved peel strength with copper foil, and low coefficient of expansion, and is applicable in manufacturing the pre-preg, the laminate, and the aluminum substrate for used in a high-performance printed circuit.

9 Claims, No Drawings

(56) References Cited

U.S. PATENT DOCUMENTS

| | | | | |
|---|---|---|---|---|
| 2005/0189877 | A1* | 9/2005 | Ishida | H01J 9/266 313/512 |
| 2005/0215668 | A1* | 9/2005 | Scholz | C08K 9/04 523/216 |
| 2007/0088123 | A1* | 4/2007 | Futatsumori | C08L 83/04 524/863 |
| 2009/0171013 | A1* | 7/2009 | Taguchi | C08K 3/22 524/588 |
| 2009/0304961 | A1* | 12/2009 | Taguchi | C08L 83/04 428/35.7 |
| 2009/0306263 | A1* | 12/2009 | Taguchi | C08L 83/04 524/404 |
| 2010/0044090 | A1* | 2/2010 | Endo | C08G 59/08 174/260 |
| 2010/0081748 | A1* | 4/2010 | Taguchi | C08L 83/04 524/433 |
| 2010/0273927 | A1* | 10/2010 | Taguchi | C08L 83/04 524/433 |
| 2010/0292428 | A1* | 11/2010 | Meador | C07F 7/21 528/28 |
| 2010/0326699 | A1* | 12/2010 | Greyling | C09D 183/04 174/137 B |
| 2011/0054072 | A1* | 3/2011 | Sawada | C08G 59/3236 523/353 |
| 2012/0237751 | A1* | 9/2012 | Kotake | B32B 5/26 428/221 |
| 2012/0247820 | A1* | 10/2012 | Miyatake | C08L 83/06 174/258 |
| 2013/0037310 | A1* | 2/2013 | Kimura | C08J 5/24 174/251 |
| 2013/0109785 | A1* | 5/2013 | Endo | C08K 3/22 523/436 |
| 2013/0330563 | A1* | 12/2013 | Kotake | C08G 73/125 428/447 |

FOREIGN PATENT DOCUMENTS

| | | |
|---|---|---|
| CN | 102181264 A | 9/2011 |
| CN | 102925055 A | 2/2013 |
| CN | 103497488 A | 1/2014 |
| CN | 103554920 A | 2/2014 |
| EP | 2174984 A1 | 4/2010 |
| JP | S62201242 A | 9/1987 |
| JP | 2002092630 A | 3/2002 |
| JP | 2006316184 A | 11/2006 |
| JP | 2007012876 A | 1/2007 |
| JP | 2008025581 A | 2/2008 |
| JP | 2008095002 A | 4/2008 |
| JP | 2009111187 A | 5/2009 |
| JP | 2010106243 A | 5/2010 |
| JP | 2010254825 A | 11/2010 |
| KR | 20040035573 A | 4/2004 |
| KR | 20140133853 A | 11/2014 |
| TW | M312864 U | 5/2007 |
| TW | 201114840 A | 5/2011 |
| WO | 2015024748 A1 | 2/2015 |

\* cited by examiner

ORGANIC SILICONE RESIN COMPOSITION AND PRE-PREG, LAMINATE, COPPER-CLAD LAMINATE, AND ALUMINUM SUBSTRATE THAT USE THE COMPOSITION

CROSS-REFERENCE TO RELATED APPLICATION

This application is a 35 U.S.C. 371 national stage filing of PCT Application No. PCT/CN2015/080474, filed on Jun. 1, 2015, which claims priority to Chinese Patent Application No. 201410829549.1, filed on Dec. 25, 2014 each of which are incorporated herein in their entirety by reference.

TECHNICAL FIELD

The present invention relates to an organosilicone resin composition, and in particular to an organosilicone resin composition with high heat resistance, halogen-free and phosphorus-free as well as low thermal expansion coefficient, and a prepreg, a laminate, a copper-clad laminate and an aluminum substrate using the same.

BACKGROUND ART

With the rapid development of electronic information technology, PCB has developed increasingly towards high density, high reliability, multi-layered, low cost and automatic continuous production, thus higher and higher requirements have been put forward to the heat resistance and reliability of the substrates for PCB. However, since the FR-4 using epoxy resin as the main body has always suffered from the defect of poor high temperature resistance, it has been inadequate for the application requiring high temperature resistance and high reliability of circuits.

Silicone resin is a thermosetting resin, one of its most prominent properties is the excellent stability against thermal oxidation. This is mainly because the skeleton of the silicone resin is Si—O—Si, so its decomposition temperature is high, it can be used under 200-250° C. in the long term without decomposition or discoloration, and it can withstand higher temperatures when coordinated with heat resistant fillers.

Meanwhile, the silicone resin has excellent electrical insulation properties, and since the silicone resin contains no polar groups, its dielectric constant and dielectric loss tangent value vary very little within a wide temperature range and frequency range, and the silicone resin has superior electrical insulation properties at the same time. Due to the carbonizable component of the silicone resin is less, its arc resistance and corona resistance are very prominent as well. Silicone resin has a prominent weather resistance, which is beyond the reach of any kind of organic resins. Even if the silicone resin is irradiated under intense ultraviolet light, it is resistant to yellowing.

At present, in order to impart flame retardancy to laminates, the formulation in combination with the brominated flame retardants is used. However, since recently more and more attentions have been paid to the environmental problems, it is desirable to use the resin compositions containing no halogen compound to further study the phosphorus compounds which can replace the halogen-containing flame retardants. The phosphorus compounds may also produce toxic compounds such as phosphine, etc. when burned, therefore it is desirable to develop a laminate having flame retardancy and a low thermal expansion coefficient even if the halogen compounds and the phosphorus compounds are not used. The silicone resin itself also has very good flame retardancy when no halogen and phosphorus-containing flame retardant is added.

In view of the high heat resistance, halogen-free and phosphorus-free flame retardancy, combined with excellent electrical insulation properties, prominent weather resistance of the silicone resin, meanwhile the completely cured silicone resin also has very low thermal expansion coefficient (<2.0%), its performance will be more excellent when coordinated with functional fillers. Therefore, the laminates prepared with the silicone resin system just meet the market demands for a high heat-resistant, halogen-free and phosphorus-free (high glass transition temperature of >200° C., and low expansion coefficient in the Z-axis of <2.0%) copper foil-clad laminate for high-performance printed circuits.

SUMMARY

In view of the above, one object of the present invention is to provide an organosilicone resin composition, which has the advantages of high heat resistance, halogen-free flame retardancy, and low expansion coefficient, etc.

In order to achieve the above object, the present invention employs the following technical solution.

An organosilicone resin composition comprises in parts by weight:
  100 parts of a condensation type silicone resin;
  0.0001-2 parts of a catalyst; and
  0.001-10 parts of an adjuvant.

The content of the catalyst is, for example, 0.0005 part, 0.001 part, 0.005 part, 0.01 part, 0.05 part, 0.1 part, 0.5 part, 0.9 part, 1.3 parts, 1.7 parts or 1.9 parts.

The content of the adjuvant is, for example, 0.001 part, 0.005 part, 0.01 part, 0.05 part, 0.1 part, 0.5 part, 1 part, 1.5 parts, 2 parts, 2.5 parts, 3 parts, 3.5 parts, 4 parts, 4.5 parts, 5 parts, 5.5 parts, 6 parts, 6.5 parts, 7 parts, 7.5 parts, 8 parts, 8.5 parts, 9 parts or 9.5 parts.

In the present invention, the condensation type silicone resin is mainly any one selected from the group consisting of a methyl silicone resin, a methylphenyl silicone resin, and a phenyl silicone resin, or a mixture of at least two selected therefrom.

In the present invention, the condensation type silicone resin is any one selected from the group consisting of dehydration condensation, dealcoholization condensation and dehydrogenation condensation, and the reaction structures thereof are as shown below:

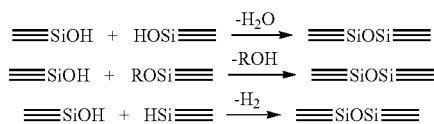

In the present invention, the condensation type silicone resin is any one selected from the group consisting of a methyl silicone resin, a methylphenyl silicone resin and a phenyl silicone resin with R/Si=1.0-1.7 (for example, 1.1, 1.2, 1.3, 1.4, 1.5, 1.6 or 1.7) (molar ratio) and Ph/(Me+Ph)=0-1.0 (for example, 0.1, 0.2, 0.3, 0.4, 0.5, 0.6, 0.7, 0.8, 0.9 or 1.0) (molar ratio), or a mixture of at least two selected therefrom, wherein Ph represents a phenyl group, Me represents a methyl group, and R represents an organic functional group selected from —CH$_3$, -Ph, —OCH$_3$, —OCH$_2$CH$_3$, —H or —OH. In the condensation type silicone resin, if the R/Si (molar ratio) is too small, and the Ph/Si (molar ratio) is too low, the silicone resin is poor in softness after curing, and the paint film becomes hard, while if the R/Si (molar ratio) is too large, and the Ph/Si (molar ratio) is too high, the laminate is low in hardness, and its curing is slow and the thermosetting property is low. Therefore, the condensation type silicone resin is preferably a methylphenyl silicone resin with R/Si=1.2-1.7 (molar ratio) and Ph/(Me+Ph)=0.2-0.6 (molar ratio).

In the present invention, the catalyst is any one selected from the group consisting of zinc naphthenate, tin naphthenate, cobalt naphthenate, iron naphthenate, cerium naphthenate, zinc carboxylate, tin carboxylate, cobalt carboxylate, iron carboxylate, cerium carboxylate, perfluorosulfonic acid, phosphonitrilic chloride, amines, quaternary ammonium bases, zinc caprylate, zinc isooctanoate, titanates and guanidine compounds, or a combination of at least two selected therefrom.

In the present invention, the adjuvant comprises any one selected from the group consisting of a silane coupling agent, a titanate coupling agent, and a dispersant, or a mixture of at least two selected therefrom.

In the present invention, the organosilicone resin composition further comprises a filler.

In the present invention, the filler comprises any one selected from the group consisting of silica, alumina, aluminum hydroxide, boron nitride, aluminum nitride, barium sulfate, mica powder, zinc borate, titanium dioxide, mica powder, silicon nitride and silicon carbide, or a mixture of at least two selected therefrom.

In the present invention, the content of the filler is 0-60 parts by weight, for example, 5 parts by weight, 10 parts by weight, 15 parts by weight, 20 parts by weight, 25 parts by weight, 30 parts by weight, 35 parts by weight, 40 parts by weight, 45 parts by weight, 50 parts by weight, 55 parts by weight, and 60 parts by weight.

An exemplary organosilicone resin composition comprises in parts by weight:
 100 parts of a condensation type silicone resin;
 0.0001-2.0 parts of a catalyst;
 0.001-10 parts of an adjuvant; and
 0-60 parts of a filler.

Preferably, the organosilicone resin composition comprises in parts by weight:
 100 parts of a condensation type silicone resin;
 0.0005-1.5 parts of a catalyst;
 0.005-5 parts of an adjuvant; and
 0-50 parts of a filler.

The term "comprising/comprise(s)" as used in the present invention means that in addition to the described components, other components may be included, which impart different characteristics to the organosilicone resin composition. Besides, the term "comprising/comprise(s)" as used in the present invention can also be replaced by "is(are)" or "consisting/consist(s) . . . of" in a closed manner.

For example, the organosilicone resin composition may contain various additives. As specific examples, flame retardants, antioxidants, heat stabilizers, antistatic agents, ultraviolet absorbers, pigments, colorants or lubricants, etc. can be listed. These various additives may be used singly or in a combination of two or more.

The second object of the present invention is to provide a resin glue solution which is obtained by dissolving or dispersing the organosilicone resin composition as described above in a solvent.

The solvent used in the present invention is not particularly limited. As specific examples, alcohols such as methanol, ethanol and butanol, etc., ethers such as ethyl cellosolve, butyl cellosolve, ethylene glycol-methyl ether, carbitol and butyl carbitol, etc., ketones such as acetone, butanone, methyl ethyl ketone, methyl isobutyl ketone, and cyclohexanone, etc., hydrocarbons such as toluene, xylene and mesitylene, etc., esters such as ethoxyethyl acetate and ethyl acetate, etc., and nitrogen-containing solvents such as N,N-dimethylformamide, N, N-dimethylacetamide, and N-methyl-2-pyrrolidone, etc. can be listed. The above-mentioned solvents may be used alone or in admixture of two or more, preferably used in admixture of aromatic hydrocarbon solvents such as toluene, xylene and mesitylene, etc. with ketone solvents such as acetone, butanone, methyl ethyl ketone, methyl isobutyl ketone, and cyclohexanone, etc.

The third object of the present invention is to provide a prepreg, which comprises a reinforcing material and the organosilicone resin composition as described above attached to the reinforcing material after impregnation and drying.

The exemplary method for preparing the prepreg is as follows:

By weight of 100 parts of the organosilicone resin composition as described above, a resin glue solution having a solid content of 50-70% by weight is prepared by adding an organic solvent such as toluene or xylene, etc., the resin glue solution is impregnated with a reinforcing material such as glass fiber cloth, which is then baked at 120-190° C. for 2-15 minutes to obtain a prepreg.

The fourth object of the present invention is to provide a laminate, which comprises at least one prepreg as described above.

The fifth object of the present invention is to provide a copper-clad laminate, which comprises at least one laminated prepreg as described above and a copper foil pressed on one side or both sides of the laminated prepreg.

The sixth object of the present invention is to provide an aluminum-based copper-clad laminate, which comprises a copper foil layer and an aluminum-based layer, an insulation layer being provided between the copper foil layer and the aluminum-based layer, wherein the insulation layer is prepared from the organosilicone resin composition as described above with addition of a thermal conductive filler.

The thermal conductive filler is any one selected from the group consisting of aluminium trioxide, silica, silicon carbide, boron nitride, aluminum nitride and magnesium oxide, or a mixture of at least two selected therefrom.

Compared with the prior art, the present invention has the following beneficial effects:

(1) The organosilicone resin composition obtained by compounding the silicone resin, the catalyst and the adjuvant has the characteristics of high heat resistance (T300>60 minutes), halogen-free and phosphorus-free, low thermal expansion coefficient (the thermal expansion coefficient (CTE) of which is less than 1.0%) and higher peel strength;

(2) The organosilicone resin composition of the present invention has the advantages of halogen-free and phosphorus-free, low smoke, low toxicity, self-extinguishing and environmental protection, etc., which provides new ideas and new methods for the application of laminates and copper-clad laminates in the fields of flame retardancy;

(3) All the technologies and equipments used in the preparation process of the present invention are general types for ordinary FR-4, and the present invention can be implemented completely with the existing production equipments, which is very conducive to the industrialization of the product.

EMBODIMENTS

The technical solution of the present invention will be further described below by way of specific embodiments.

Example 1

100.0 parts of a methyl silicone resin with R/Si=1.1 (molar ratio) and Ph/(Ph+Me)=0 (molar ratio) was weighed and dissolved in 60.0 parts of a toluene solvent, then stirred to dissolve it completely. After the silicone resin was dissolved completely, 0.0001 parts of zinc isooctanoate, and 0.001 parts of a silane coupling agent γ-(2,3-epoxypropoxy)propyltrimethoxysilane (supplied by Dow Corning Corporation, U.S.A.) were added, and stirred to be mixed well so that a glue solution was obtained. A smooth and glabrous E-glass fiber cloth with a thickness of 0.1 mm was selected, evenly coated with the glue solution obtained above, and baked in the oven at 170° C. for 5 minutes to obtain a prepreg. 8 sheets of prepregs obtained above were laminated and 35 μm of copper foils were attached to the upper and lower surfaces, then placed in a vacuum hot press at a pressure of 3 MPa and a temperature of 220° C. to be pressed for 3 hours to obtain a laminate.

Example 2

100.0 parts of a methylphenyl silicone resin with R/Si=1.4 (molar ratio) and Ph/(Ph+Me)=0.5 (molar ratio) was weighed and dissolved in 70.0 parts of a toluene solvent, then stirred to dissolve it completely. After the silicone resin was dissolved completely, 23.0 parts of silica fine powder, 0.1 parts of cobalt acetylacetonate, 1.5 parts of a silane coupling agent γ-methylacryloyloxypropyltrimethoxysilane coupling agent (supplied by Hubei WuDa Silicone New Materials Co., Ltd.) were added, and stirred to be mixed well so that a glue solution was obtained.

A prepreg and a double-sided copper-clad laminate having a thickness of 1.0 mm were obtained in the same manners as those in Example 1 except that the resin glue solution prepared above was used.

Example 3

100.0 parts of a phenyl silicone resin with R/Si=1.7 (molar ratio) and Ph/(Ph+Me)=1.0 (molar ratio) was weighed and dissolved in 100.0 parts of a toluene solvent, then stirred to dissolve it completely. After the silicone resin was dissolved completely, 50.0 parts of alumina, 1.5 parts of titanate, and 8.7 parts of a silane coupling agent γ-methylacryloyloxypropyltrimethoxysilane (supplied by Hubei WuDa Silicone New Materials Co., Ltd.) were added, and stirred to be mixed well so that a glue solution was obtained.

A prepreg and a double-sided copper-clad laminate having a thickness of 1.0 mm were obtained in the same manners as those in Example 1 except that the resin glue solution prepared above was used.

Example 4

60.0 parts of a methyl silicone resin with R/Si=1.1 (molar ratio) and Ph/(Ph+Me)=0 (molar ratio) and 40.0 parts of a methylphenyl silicone resin with Ph/(Ph+Me)=0.9 (molar ratio) were weighed and dissolved in 85.0 parts of a toluene solvent, then stirred to dissolve it completely. After the silicone resin was dissolved completely, 25.0 parts of alumina, 10.0 parts of silica fine powder, 0.08 parts of cobalt acetylacetonate, and 1.5 parts of a silane coupling agent γ-methylacryloyloxypropyltrimethoxysilane coupling agent (supplied by Hubei WuDa Silicone New Materials Co., Ltd.) were added, and stirred to be mixed well so that a glue solution was obtained.

A prepreg and a double-sided copper-clad laminate having a thickness of 1.0 mm were obtained in the same manners as those in Example 1 except that the resin glue solution prepared above was used.

Comparative Example 1

100 parts of a methylphenylvinyl silicone resin (the content of vinyl being 1.0%) was weighed and dissolved into 70 parts of a solvent, 3.1 parts of a methylphenyl hydrogen-containing silicone oil (the content of the hydrogen contained therein being 1.2%) was added after uniformly dissolved, 0.001 parts of hexynol was weighed after uniformly stirring under high speed, then 0.01 parts of platinum-methylphenylvinyl complex was added after stirring for 30 minutes, and 1.5 parts of a silane coupling agent γ-methylacryloyloxypropyltrimethoxysilane coupling agent (supplied by Hubei WuDa Silicone New Materials Co., Ltd.) and 23.0 parts of silica fine powder were added after continuously stirring for 30 minutes, then the mixture was stirred at room temperature for 1 hour, emulsified for 20 minutes to obtain a silicone resin glue solution.

A prepreg and a double-sided copper-clad laminate having a thickness of 1.0 mm were obtained in the same manners as those in Example 1 except that the resin glue solution prepared above was used.

Comparative Example 2

100.0 parts of a methylphenyl silicone resin with R/Si=1.4 (molar ratio) and Ph/(Ph+Me)=0.5 (molar ratio) was weighed and dissolved in 70.0 parts of a toluene solvent, then stirred to dissolve it completely. After the silicone resin was dissolved completely, 70.0 parts of silica fine powder, 0.1 parts of cobalt acetylacetonate, and 1.5 parts of a silane coupling agent γ-methylacryloyloxypropyltrimethoxysilane coupling agent (supplied by Hubei WuDa Silicone New Materials Co., Ltd.) were added, and stirred to be mixed well so that a glue solution was obtained.

A prepreg and a double-sided copper-clad laminate having a thickness of 1.0 mm were obtained in the same manners as those in Example 1 except that the resin glue solution prepared above was used.

Comparative Example 3

100.0 parts of a phenyl silicone resin with R/Si=1.7 (molar ratio) and Ph/(Ph+Me)=1.0 (molar ratio) was weighed and dissolved in 100.0 parts of a toluene solvent, then stirred to dissolve it completely. After the silicone resin was dissolved completely, 50.0 parts of alumina, 1.5 parts of titanate, and 12.0 parts of a silane coupling agent γ-methylacryloyloxypropyltrimethoxysilane (supplied by Hubei WuDa Silicone New Materials Co., Ltd.) were added, and stirred to be mixed well so that a glue solution was obtained.

A prepreg and a double-sided copper-clad laminate having a thickness of 1.0 mm were obtained in the same manners as those in Example 1 except that the resin glue solution prepared above was used.

Comparative Example 4

100.0 parts of a phenyl silicone resin with R/Si=1.9 (molar ratio) and Ph/(Ph+Me)=1.0 (molar ratio) was weighed and dissolved in 100.0 parts of a toluene solvent, then stirred to dissolve it completely. After the silicone resin was dissolved completely, 50.0 parts of alumina, 1.5 parts of titanate, and 8.7 parts of a silane coupling agent γ-methylacryloyloxypropyltrimethoxysilane (supplied by Hubei WuDa Silicone New Materials Co., Ltd.) were added, and stirred to be mixed well so that a glue solution was obtained.

A prepreg and a double-sided copper-clad laminate having a thickness of 1.0 mm were obtained in the same manners as those in Example 1 except that the resin glue solution prepared above was used.

Effect Confirmation:

(1) Test for Z-Expansion Coefficient (CTE) (Thermal Mechanical Analysis Method)

Test method: IPC-TM-650 2.4.24 was used, and the test data were shown in the table below.

(2) Thermal Delamination Time (T300) (Thermal Mechanical Analysis Method)

Test method: IPC-TM-650 2.4.24.1 was used, and the test data were shown in the table below.

(3) Flame Rating

Test method: Reference to the United States UL94 standard was made, and the test data were shown in the table below.

(4) Peel Strength Test

Test method: Method IPC-TM-650 2.4.8 was used to test, and the test data were shown in the table below.

Analysis of Physical Properties:

As can be seen from the data in the above table, Examples 1-4 had very low thermal expansion coefficient, high thermal delamination time, halogen-free and phosphorus-free flame retardancy and better peel strength, which can satisfy the requirements of copper-clad laminates. When Comparative Example 1 was compared with Example 2, since the silicone resin was a methylphenylvinyl silicone resin, and an addition type curing method was used, the laminate had great expansion coefficient, low peel strength and less prominent flame retardancy effect after curing; when Comparative Example 2 was compared with Example 2, the content of filler was out of range, resulting in a decrease in peel strength with copper foil and a decrease in thermal delamination time; when Comparative Example 3 was compared with Example 3, the used amount of the adjuvant was not within the protection scope, and since most of the adjuvants were small molecules, the laminate would release more small molecules at high temperatures if the added amount of the adjuvants was too large, so that the thermal expansion coefficient was increased and the delamination time was shortened at the same time; and when Comparative Example 4 was compared with Example 3, the R/Si value was out of range, the greater the R/Si value was, the lower the cross-linking density of resin was, and the more the resin tended to thermoplastic resin, so that the thermal expansion coefficient was increased, the stability at high temperatures was lowered, and the thermal delamination time was reduced.

Applicant stated that although the detailed methods of the present invention have been described by the above examples in the present invention, the present invention is not limited to the detailed methods described above, that is to say, it does not mean that the present invention has to be

| Test items | Example 1 | Example 2 | Example 3 | Example 4 | Comparative Example 1 | Comparative Example 2 | Comparative Example 3 | Comparative Example 4 |
|---|---|---|---|---|---|---|---|---|
| Methylphenyl silicone resin | — | 100 | — | 40 | — | 100 | — | — |
| Methyl silicone resin | 100 | — | — | 60 | — | — | — | — |
| Phenyl silicone resin | — | — | 100 | — | — | — | 100 | 100 |
| Methylvinyl silicone resin | — | — | — | — | 100 | — | — | — |
| R/Si | 1.1 | 1.4 | 1.7 | 1.1/1.7 | — | 1.4 | 1.7 | 1.9 |
| Ph/(Me + Ph) | 0 | 0.5 | 1.0 | 0/0.9 | — | 0.5 | 1.0 | 1.0 |
| Silane coupling agent | 0.001 | 1.5 | 8.7 | 1.5 | 1.5 | 1.5 | 12.0 | 8.7 |
| Silica fine powder | — | 23 | — | 10 | 23 | 70 | — | — |
| Alumina | — | — | 50 | 25 | — | — | 50 | 50 |
| Test results | | | | | | | | |
| CTE (%) | 0.7451 | 0.9007 | 0.9201 | 0.9114 | 5.6473 | 0.9156 | 1.6425 | 2.5214 |
| T300 (min) | >60 | >60 | >60 | >60 | 23.1 | 56.2 | 45.7 | 51.2 |
| Flame rating | UL V-0 | UL V-0 | UL V-0 | UL V-0 | UL V-1 | UL V-0 | UL V-0 | UL V-0 |
| Peel strength test N/mm | 0.56 | 0.62 | 0.58 | 0.59 | 0.39 | 0.37 | 0.58 | 0.50 |

The invention claimed is:

1. An aluminum-based copper-clad laminate comprising a copper foil layer and an aluminum-based layer with an insulation layer being coated between the copper foil layer and the aluminum-based layer, wherein the insulation layer is prepared from an organosilicone resin composition, wherein the organosilicone resin composition comprises in parts by weight: 100 parts of a condensation type silicone resin; 0.0001-2 parts of a catalyst; and 0.001-10 parts of an adjuvant, and
wherein the condensation type silicone resin is any one selected from the group consisting of a methyl silicone resin, a methylphenyl silicone resin and a phenyl silicone resin with R/Si=1.2-1.7 (molar ratio) and Ph/(Me+Ph)=0.2-0.6 (molar ratio), or a mixture of at least two selected therefrom, wherein Ph represents a phenyl group, Me represents a methyl group, and R represents an organic functional group selected from —CH$_3$, -Ph, —OCH$_3$, —OCH$_2$CH$_3$, —H or —OH.

2. The aluminum-based copper-clad laminate according to claim 1, wherein the condensation type silicone resin is any one selected from the group consisting of a methyl silicone resin, a methylphenyl silicone resin, and a phenyl silicone resin, or a mixture of at least two selected therefrom.

3. The aluminum-based copper-clad laminate of claim 1, wherein the catalyst is any one selected from the group consisting of zinc naphthenate, tin naphthenate, cobalt naphthenate, iron naphthenate, cerium naphthenate, zinc carboxylate, tin carboxylate, cobalt carboxylate, iron carboxylate, cerium carboxylate, perfluorosulfonic acid, phosphonitrilic chloride, amines, quaternary ammonium bases, zinc caprylate, zinc isooctanoate, titanates and guanidine compounds, or a combination of at least two selected therefrom.

4. The aluminum-based copper-clad laminate of claim 1, wherein the organosilicone resin composition further comprises a filler.

5. The aluminum-based copper-clad laminate of claim 4, wherein the filler comprises any one selected from the group consisting of silica, alumina, aluminum hydroxide, boron nitride, aluminum nitride, barium sulfate, mica powder, zinc borate, titanium dioxide, talc powder, silicon nitride and silicon carbide, or a mixture of at least two selected therefrom.

6. The aluminum-based copper-clad laminate of claim 4, wherein the content of the filler is greater than 0 to 60 parts by weight.

7. The aluminum-based copper-clad laminate of claim 1, wherein the organosilicone resin composition comprises in parts by weight: 100 parts of a condensation type silicone resin; 0.0001-2.0 parts of a catalyst; 0.001-10 parts of an adjuvant; and 0-60 parts of a filler.

8. The aluminum-based copper-clad laminate of claim 1, wherein the adjuvant comprises any one selected from the group consisting of a silane coupling agent, a titanate coupling agent, and a dispersant, or a mixture of at least two selected therefrom.

9. The aluminum-based copper-clad laminate of claim 1, wherein the organosilicone resin composition comprises in parts by weight: 100 parts of a condensation type silicone resin; 0.0005-1.5 parts of a catalyst; 0.005-5 parts of an adjuvant; and 0-50 parts of a filler.

* * * * *